(12) United States Patent
Oldsen et al.

(10) Patent No.: US 8,039,950 B2
(45) Date of Patent: Oct. 18, 2011

(54) SOLDER MATERIAL LINING A COVER WAFER ATTACHED TO WAFER SUBSTRATE

(75) Inventors: Marten Oldsen, Hamburg (DE); Wolfgang Reinert, Neumuenster (DE); Peter Merz, Beldorf (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 268 days.

(21) Appl. No.: 12/092,892

(22) PCT Filed: Nov. 8, 2006

(86) PCT No.: PCT/EP2006/068252
§ 371 (c)(1),
(2), (4) Date: May 7, 2008

(87) PCT Pub. No.: WO2007/054524
PCT Pub. Date: May 18, 2007

(65) Prior Publication Data
US 2008/0317995 A1      Dec. 25, 2008

(30) Foreign Application Priority Data

Nov. 10, 2005   (DE) .......................... 10 2005 053 722

(51) Int. Cl.
*H01L 23/48* (2006.01)
*H01L 21/30* (2006.01)
(52) U.S. Cl. .......................... 257/704; 257/772; 438/456
(58) Field of Classification Search .......................... None
See application file for complete search history.

(56) References Cited

U.S. PATENT DOCUMENTS

| | | | |
|---|---|---|---|
| 5,756,901 A | 5/1998 | Kurle et al. | |
| 6,030,850 A | 2/2000 | Kurle et al. | |
| 6,062,461 A * | 5/2000 | Sparks et al. | 228/123.1 |
| 6,367,988 B1 | 4/2002 | Auracher et al. | |
| 6,454,160 B2 | 9/2002 | Gueissaz | |
| 2003/0206083 A1 | 11/2003 | Takahashi | |
| 2004/0087043 A1 | 5/2004 | Lee et al. | |
| 2005/0082653 A1 | 4/2005 | McWilliams et al. | |
| 2005/0212115 A1 | 9/2005 | McKinnell et al. | |

FOREIGN PATENT DOCUMENTS

| | | |
|---|---|---|
| DE | 195 37 814 A1 | 4/1997 |
| DE | 197 11 283 A1 | 10/1998 |
| DE | 100 05 555 A1 | 8/2001 |
| DE | 10 2005 053 722 B4 | 5/2007 |

(Continued)

*Primary Examiner* — Alonzo Chambliss
(74) *Attorney, Agent, or Firm* — Arent Fox LLP

(57) ABSTRACT

The invention relates to a cover wafer with a core and with an inside, whereby the inside has one or more annular outer areas, (an) annular area(s), which inwardly adjoin(s) the outer area(s), and has (a) inner area(s), and to a component cover with only one annular outer area on its inside. The invention is characterized in that at least area(s) has/have a buffer layer, which has a wetting angle of <35° for a metallic eutectic solution that melts in a range of >265° C. to 450° C. The invention also relates to a component cover having one of the areas which has said buffer layer in a comparable manner. The invention additionally relates to a wafer component or to a component, which can be inserted using microsystem technology and which has a cover wafer or component cover applied with the aid of a solder material, and to a method for the production thereof.

31 Claims, 2 Drawing Sheets

FOREIGN PATENT DOCUMENTS

| | | |
|---|---|---|
| EP | 0 962 275 A2 | 12/1999 |
| EP | 1 108 677 A1 | 6/2001 |
| EP | 1 501 756 B1 | 2/2005 |
| GB | 2 338 083 A | 12/1999 |
| JP | 11-111878 | 4/1999 |
| JP | 2004-202604 | 7/2004 |
| WO | WO 03/084861 A2 | 10/2003 |
| WO | WO 2005/050751 A2 | 6/2005 |

* cited by examiner

Fig. 1a
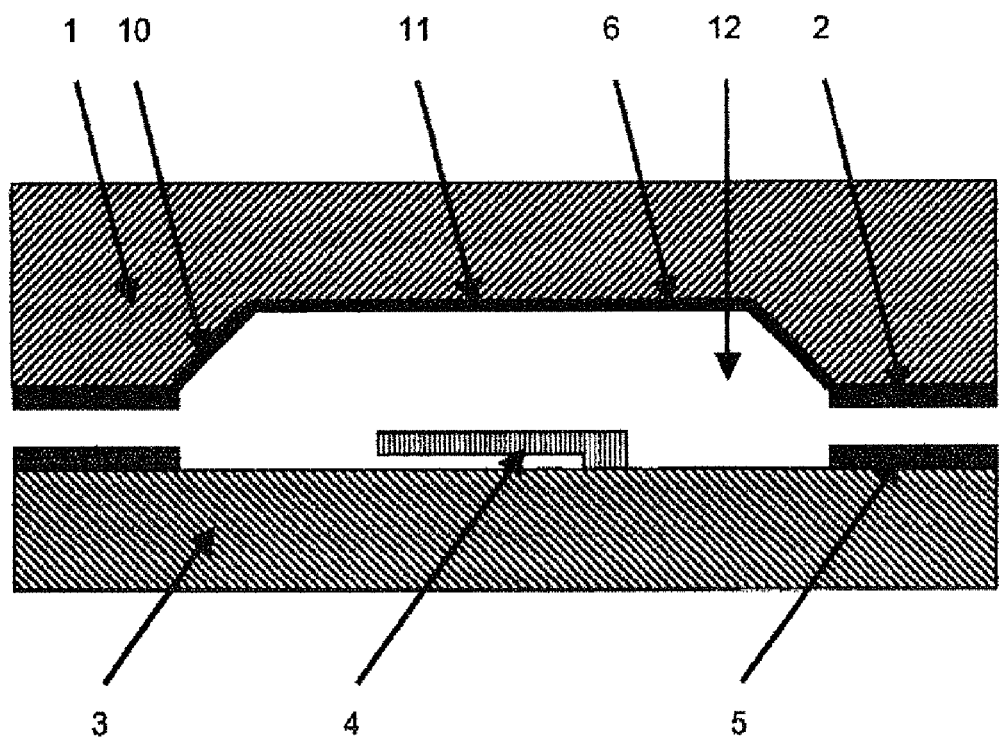
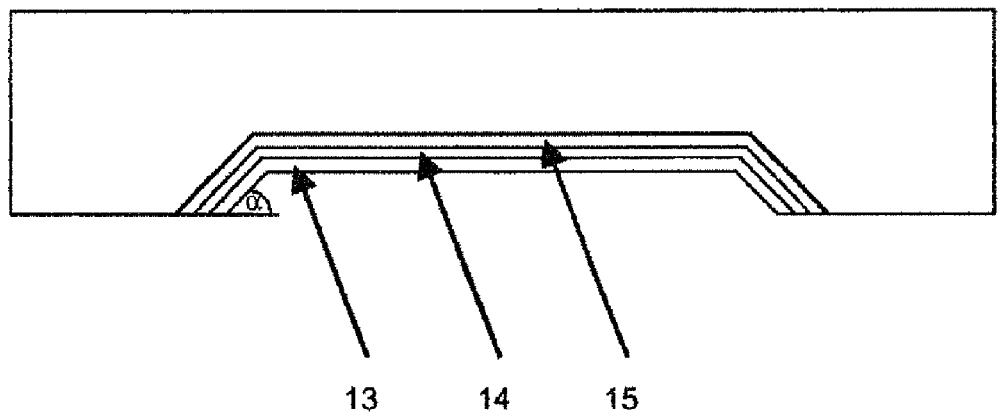
Fig. 2

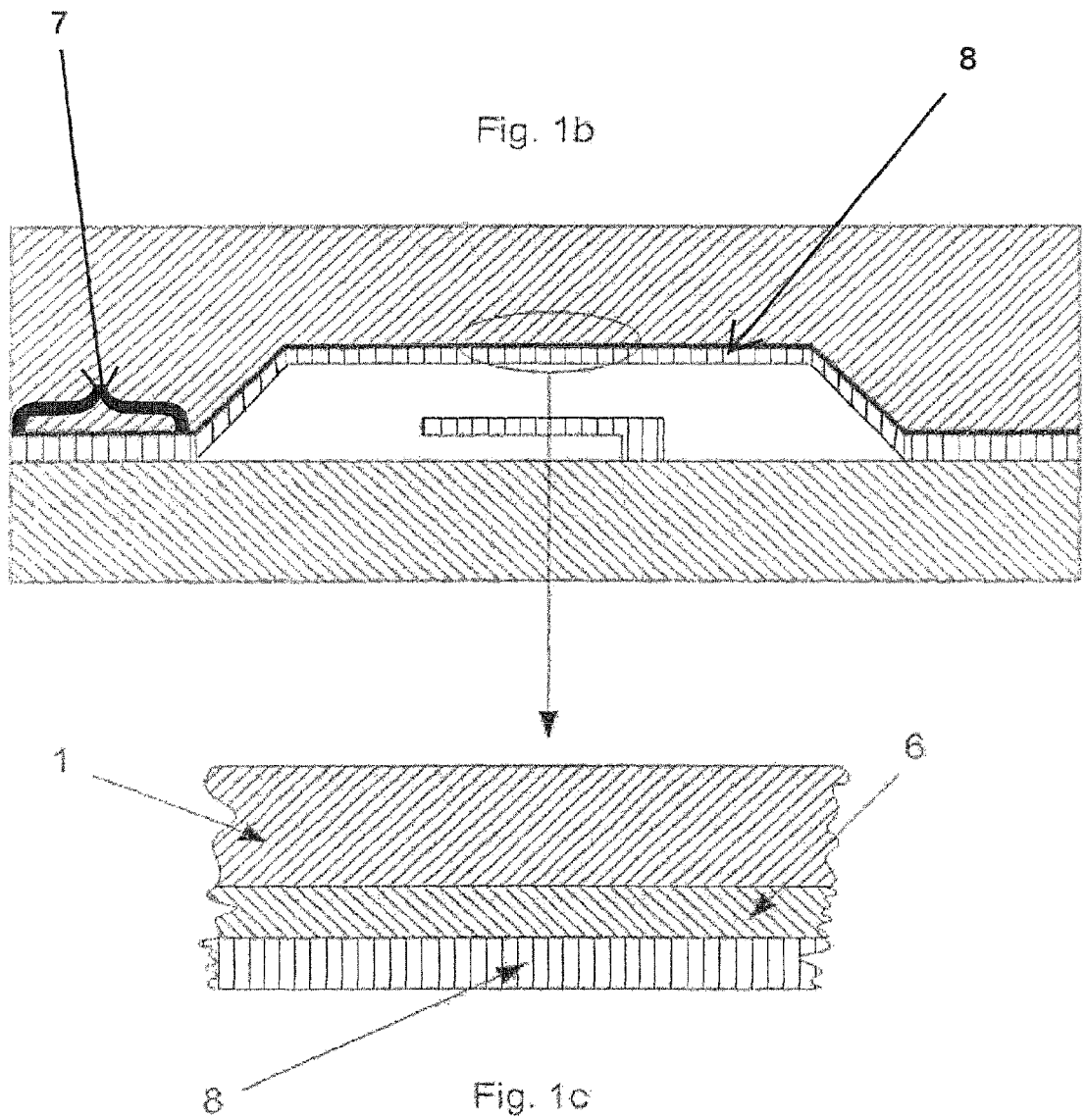

SOLDER MATERIAL LINING A COVER WAFER ATTACHED TO WAFER SUBSTRATE

CROSS-REFERENCE TO RELATED APPLICATION

This application is a 371 National Stage entry of International Application No. PCT/EP2006/068252 filed Nov. 8, 2006, now WO 2007/054524 publication date May 18, 2007, the entire specification, claims and drawings of which are incorporated herewith by reference.

The present invention is directed at articles and processes which are used in controlling the spread of wetting of excess metal melts in the encapsulation of microcomponents, primarily on the wafer level.

Current components in microsystems technology are preferably produced with semiconductor engineering production methods. In this way many components can be economically produced at the same time. But, due to their very small dimensions, these components are extremely sensitive and must be protected against external influences during operation and also during production. This is accomplished by these components being hermetically sealed by protective caps.

Capping processes have been known for a long time. Frequently, use is made in the processes of a separate cover chip (cover wafer) that is cemented onto the wafer containing the active structures or that is applied by other joining methods and thus the components are hermetically sealed. Processes which encapsulate the MST wafer on the wafer level have likewise been known for a long time. A wafer which can consist, for example, of glass or silicon and which generally has one or more cavities for holding active component parts is connected by means of an anodic connection or by using glass solder. The use of metallic or metal-containing solders is less common in wafer bonding technology.

A cover chip or cover wafer which is to be connected to the wafer containing the active structures (for example sensors such as speed, acceleration or rpm sensors) by soldering has a core with an inside (i.e., the side facing the wafer with the active structures) which has annular regions which are to be soldered to the corresponding regions on the wafer which contains sensors or the like. The corresponding regions on the wafer containing the sensors or the like surround these structures, so that the latter after soldering the two wafers are hermetically sealed in a chamber. This applies comparably to individual components or parts, to the extent working is not to take place on the wafer level. Here each lower part (substrate) which contains one or more active structures is also to be connected to a cover by way of an annular bonding region. The annular bonding region in this cover part, just like the annular regions of the aforementioned cover wafer, is referred to below as the annular outside region.

The material for metallic solders for the indicated solder connections must be chosen with consideration of the temperatures which can or must occur in the production of the components which are to be joined to one another later, while the solder material possibly has already been applied at the suitable location. The solder material must therefore be chosen such that it does not melt at the highest temperatures which are reached or are necessary for the indicated process steps. On the other hand, the solder material should melt at a temperature which facilitates joining of the components without damage to the parts being able to occur based on the temperatures necessary for this purpose. A temperature range between somewhat above 260° C. and 450° C. has proven suitable for this purpose. But only a few metallic materials melt in this range. Most of these materials contain gold, often in the form of a eutectic with another element such as tin or silicon. Tin-based solders can also be used. In particular AuSi bonding technology is demanding, but also has some important advantages such as narrow sealing frames, covers of surface structures, high strength and no need for component-side metal coating. But the disadvantage in the use of the aforementioned solder materials is the difficult control of the spreading of excess, very thin-liquid solder material. This forms small droplets especially when emerging into the inner cavity/cavities on the surfaces of these spaces. Since generally the component as a whole when soldering is kept at the solder temperature, often for several minutes, these small droplets then fall or drip down from the cover of the cavities and can damage the active structure(s) of the component.

The object of this invention is to prevent formation of these droplets and thus to prevent damage to the active components in the soldering process.

This object is achieved by the proposal that a buffer material be provided for a cover wafer or for the corresponding component cover in an annular region within the annular outside region(s) via which the components are soldered to one another; on the buffer material the solder material used wetting so well that droplets do not form. In other words: The buffer layer should have a very small wetting angle for liquid droplets of the liquid solder material. Generally, such a material additionally has a certain holding capacity for the liquid solder material so that it is "sucked in"; this additionally contributes to the desired effect.

The invention accordingly makes available a cover wafer according to claim 1, a cover according to claim 2, a wafer component according to claim 16, a component which can be inserted using Microsystems technology according to claim 17, and a joining method according to claim 19. Special embodiments will be disclosed in the dependent claims.

Cover wafers or covers can be formed from any material, such as a metal, a ceramic, glass or silicon or an oxide material or can have this material as an outermost layer.

The same applies to that wafer which is used as the substrate or base for an active structure, such as a sensor or a detector, which has been attached to it, or to the corresponding lower part.

The invention will be detailed below using FIGS. 1 (*a*) to 1 (*c*) and FIG. 2.

FIG. 1*a* shows in cross section a cutaway view of a cover wafer 1 and a wafer ("sensor wafer") 3 which is assigned to it and which contains active structures. The cutaway view of the sensor wafer shows an active structure 4 within recess 12 which is to be protected and which is surrounded by an annular external region to which solder material 5 has been applied. The cutaway view of the cover wafer shows the corresponding region, the annular outside region likewise having solder material 2 here. It should be clear that solder material need not necessarily be placed on both annular regions; generally it is sufficient to provide this material only on one of the two wafers. The annular outside region of the cover wafer is adjoined to the inside by an annular region 10 and an inside region 11. In this embodiment these two regions are made as a cavity for holding the active structure 4, the region 10 with an angle α being set back from the plane of the inside of the cover (see FIG. 2) and a having a value of preferably 45° to 90°, more preferably from 48° to 65°, and most especially preferably of approximately 54°. But it should be clear that instead, the cover wafer can be flat or arched differently, while the active structure is housed in a recess 12 of the bottom wafer. In order to ensure controlled wetting of the metal-containing solder which is used in the bonding, a buffer layer 6 is applied to the cover wafer or also to the sensor wafer between the active structure and the annular outside region. This buffer layer can either be structured, for example, in the form of webs which point radially to the inside, or applied over the entire surface (as a ring or a surface which completely fills the region) in the cavities of the cover or sensor wafer. It consists preferably of a metal, for example of gold (and then preferably in a thickness of at least 100 nm), but can also be built up from a multilayer system. A multilayer system is shown schematically in FIG. 2. It can be envisaged above all if, for example, an adhesion promoting 15 and/or a gas blocking layer 14 are required under the buffer cover layer 13 or their presence leads to advantageous effects.

The two indicated wafers 1 and 3 are adjusted to one another. If at this point the cover wafer is connected to the wafer containing the active structures by way of the respective annular outer regions (the bonding region is designated as 7 in FIG. 1b) a metallic or metal-containing (for example eutectic AuSi) solder 8 (see FIGS. 1b and 1c) is formed. The buffer layer absorbs excess solder and provides for controlled wetting. Without the buffer layer the solder would collect uncontrolled in clumps on surfaces which can be poorly wetted by metals, such as, for example, oxide surfaces or silicon; these clumps are deposited on the sensor structure and thus can cause failure of the component.

If work is not to be done on the wafer level, individual component covers can be connected to the corresponding substrates which have one or more active structures. The figures can be read for this version as a representation of substrates 3 with the component covers 1 which can be connected to the insertable components using microsystems technology.

The advantage of integration of the buffer layer provided according to the invention thus lies in the increase of production yields and in prevention of failures of the components during operation, and thus leads to more economical production of components which have been hermetically encapsulated using microsystems technology.

The buffer layer is advantageously prepared by vapor deposition of a metal layer or by sequential vapor deposition of several metal layers. Providing an additionally applied metallic galvanic layer is favorable. Vapor deposition can take place on all sides or using suitable masks when structured layers are desired.

The wetting angle of the buffer layer is advantageously less than 35°, preferably it is less than 12°, and especially less than 9°.

The buffer layer preferably has a metallic cover layer 13, and the metal of the cover layer can be chosen from among precious metals, especially gold, copper and silver, nickel and nickel alloys such as, for example, a nickel/silver alloy, and oxide-free nonprecious metals and semimetals. Among them, gold is especially preferred.

If there is an adhesion promoting layer 15 and/or a barrier layer 14 under the cover layer, it is preferred that the material of the layer under the cover layer be chosen from among tungsten, titanium, chromium, an alloy of the aforementioned metals with another metal, an alloy of two or three of the aforementioned metals, nickel (under the condition that the cover layer is not formed exclusively from nickel), a nickel alloy, especially a nickel-vanadium alloy, palladium or platinum. It is most especially preferred that underneath the cover layer there is a barrier layer, and under that an adhesion promoting layer. The following values are individually preferred: The adhesion promoting layer can have a thickness from approximately 5 to 100, preferably 20-100 nm, the barrier layer can have a thickness of approximately 30-400 nm and the cover layer can have a thickness from approximately 100 nm to approximately 800 nm, preferably up to approximately 500 nm.

The annular region or regions 10 and/or the inner region or regions 11 can be provided with a getter layer for absorbing unwanted gases, and the getter layer should preferably be located underneath the buffer layer or (directly) underneath the cover layer.

In one specific configuration of the invention some or all the outer sides of the cover layer are covered with a gold cover layer.

After connecting the cover wafer to the wafer which contains the active structures, the individual components can be separated from it; this conventionally takes place in a sawing line.

The invention comprises not only the corresponding joined wafer combinations of the bottom wafer and cover layer, but also individual components, both those which are formed when the wafer according to the invention is cut, and also those which have been joined individually according to the invention.

The invention claimed is:

1. A cover wafer with a core (1) and an inside (7, 10, 11), the inside comprising one or more of: (an) annular outer region(s) (7), (an) annular region(s) (10) which adjoin(s) the outer region(s) to the inside, and (an) inner region(s) (11), wherein at least the annular region(s) (10) comprise(s) a buffer layer which has a wetting angle of <35° for a metallic eutectic which melts in the range of between 265° C. and 450° C., characterized in that a solder material (2;5) is continuously present on the annular outer regions which forms a gold silicon eutectic upon bonding the cover wafer with a wafer substrate (3).

2. A component cover with a core (1) and an inside (7, 10, 11), the inside comprising an annular outer region (7), an annular region (10) which adjoins the outer region to the inside, and an inner region (11), wherein at least the annular region (10) comprises a buffer layer which has a wetting angle of <35° for a metallic eutectic which melts in the range of between 265° C. and 450° C., characterized in that a solder material (2;5) is continuously present on the annular outer region (7) which forms a gold silicon eutectic upon bonding the cover wafer with a wafer substrate (3).

3. The cover wafer or component cover according to one of claim 1 or 2, characterized in that the annular region (10) or each annular region (10) and each pertinent inner region (11) are parts of a recess (12).

4. The cover wafer or component cover according to claim 3, characterized in that the annular outer region(s) (7) of the inside are essentially planar and the annular region(s) (10) are made as a bevel with an angle α from 45° to 90° to the annular outer region(s) (7).

5. The method according to claim 4, wherein the angle α is from 54°.

6. The cover wafer or component cover according to one of claim 1 or 2, characterized in that each annular region (10) and each inner region (11) are covered with a continuous buffer layer.

7. The cover wafer or the component cover according to one of claim 1 or 2, characterized in that the buffer layer has a metallic cover layer (13), the metal of the cover layer being selected from among a precious metal, an oxide-free non-precious metal or a semi-metal.

8. The cover wafer or component cover according to claim 7, characterized in that the buffer layer underneath the cover layer (13) has an adhesion promoting layer (15) and/or a barrier layer (14).

9. The cover wafer or component cover according to claim 8, wherein underneath the cover layer (13) there is a layer which consists of tungsten, titanium, chromium, an alloy of the aforementioned metals with another metal, an alloy of two or three of the aforementioned metals, nickel, wherein the cover layer is not formed exclusively from nickel, a nickel alloy, a nickel-vanadium alloy, palladium and platinum.

10. The cover wafer or component cover according to claim 9, characterized in that under the cover layer (13) there is a barrier layer (14) and under the barrier layer there is an adhesion promoting layer (15).

11. The cover wafer or component cover according to claim 10, characterized in that there is at least one of: an adhesion promoting layer (15) in a thickness from approximately 5 to 100, a barrier layer (14) in a thickness from 30 to approximately 400 nm and that the cover layer (13) has a thickness from approximately 100 nm to approximately 800 nm.

12. The cover wafer or component cover according to claim 11, characterized in that the cover layer consists of gold.

13. The cover wafer or component cover according to claim 11, characterized in that the annular outer region(s) (7) have a buffer layer (2), which is preferably formed from gold and has a thickness of at least 100 nm.

14. The cover wafer or component cover of claim 11, wherein at least one of: the adhesion promoting layer (15) has a thickness from approximately 20 to 100 nm and the cover layer (13) has a thickness up to approximately 500 nm.

15. The method of claim 7, wherein the precious metal is selected from the group consisting gold, copper, silver, nickel, and alloys thereof.

16. The method of claim 15, wherein the alloys are nickel/silver alloys.

17. The cover wafer or component cover according to claim 1 or 2, characterized in that in part or at least in one part of the inner region(s) (11) of the inside and/or in part or at least in one part of the annular region(s) (10) of the inside it has a getter layer underneath the buffer layer or underneath the cover layer.

18. The cover wafer or component cover according to one of claim 1 or 2, characterized in that its outer side(s) is/are covered with a cover layer of gold.

19. A cover wafer or component cover according to claim 1 or 2, wherein the buffer layer is made as a layer which is peripherally continuous or in the form of webs which point radially to the inside.

20. A wafer component, comprising a wafer substrate (3) with a top side which has one or more annular outer regions (7) and located within the annular outer region (7) or each annular outer region (7) has an active structure (4), and a cover wafer with a core (1) and an inside (7, 10, 11), the inside comprising one or more of: (an) annular outer region(s) (7), (an) annular region(s) (10) which adjoin(s) the outer region(s) to the inside, and (an) inner region(s) (11), the annular outer region(s) (7) of the top of the substrate and the annular outer region(s) (7) of the inside of the cover wafer having a structure which matches one another and being connected in a hermetically sealed way to one another using a solder material which melts in the temperature range between 265° C. and 450° C., wherein at least the annular region(s) (10) of the cover wafer (10) comprise(s) a buffer layer which has a wetting angle of <35° for the said solder material, characterized in that the said solder material is a gold silicon eutectic.

21. A component which can be used in microsystems technology, comprising a substrate (3) with a top side which has an annular outer region (7) and located within said annular outer region has an active structure (4), and a component with a core (1) and an inside (7, 10, 11), the inside comprising an annular outer region (7), an annular region (10) which adjoins the outer region to the inside, and an inner region (11), the annular outer region (7) of the top of the substrate and the annular outer region (7) of the inside of the cover wafer having a structure which matches one another and being connected in a hermetically sealed way to one another using a solder material which melts in the temperature range between 265° C. and 450° C., wherein at least the annular region (10) comprise(s) a buffer layer which has a wetting angle of <35° for the said solder material, characterized in that the said solder material is a gold silicon eutectic.

22. The component according to claim 21, wherein the buffer layer is made in the form of one of: a layer which is peripherally continuous and webs which point radially to the inside.

23. The component according to claim 21, characterized in that the annular region (10) and the pertinent inner region (11) are parts of a recess (12).

24. The component according to claim 21, characterized in that the annular region (10) and the inner region (11) are covered with a continuous buffer layer.

25. The component according to claim 21, characterized in that the buffer layer has a metallic cover layer (13), the metal of the cover layer being selected from among precious metals, and from among oxide-free non-precious metals and semi-metals.

26. The component according to claim 25, characterized in that the cover layer consists of gold.

27. The component according to claim 21, characterized in that in the inner region or at least in a part of the inner region (11) of the inside and/or in the annular region (10) or at least in a part of the annular region (10) of the inside, the component cover has a getter layer underneath the buffer layer or underneath the cover layer.

28. The component according to claim 21, characterized in that the annular region (7) has a buffer layer (2) formed from gold, having a thickness of at least 100 nm.

29. A method for connecting two wafer components or components which can be used in microsystems technology, the first component being adapted to be a bottom wafer or substrate (3), and the second component thereof being adapted to be a cover wafer or component cover, wherein the bottom wafer or the substrate, respectively, as well as the cover wafer or the component cover, respectively, have annular outer regions (7) which match one another and which face one another, characterized in that
at least one of the two components is prepared in a state in which the solder material (2; 5), which forms a gold silicon eutectic upon bonding the two components, is located on the annular outer region (7) or all annular outer regions (7), which has a melting point in the range between 265° C. and 450° C. and that at least the component which serves as a cover wafer or component cover is provided in the annular regions (10) which adjoin the outer region to the inside with a buffer layer which has a wetting angle of <35° for the said solder material in the liquid state, and
the two components are bonded to one another at a temperature of between_265° to 450° C.

30. The method according to claim 29, wherein the buffer layer is made as a layer which is peripherally continuous or in the form of webs which point radially to the inside.

31. The method according to claim 29 or 30, furthermore comprising the separation of a plurality of the components which were produced by the bonding.

* * * * *